United States Patent
Kong et al.

(10) Patent No.: US 8,059,774 B2
(45) Date of Patent: Nov. 15, 2011

(54) FREQUENCY LOCK DETECTION

(75) Inventors: Shyang Kye Kong, San Diego, CA (US);
Simon Pang, San Diego, CA (US);
Philip Michael Clovis, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 839 days.

(21) Appl. No.: 12/129,477

(22) Filed: May 29, 2008

(65) Prior Publication Data
US 2009/0296857 A1 Dec. 3, 2009

(51) Int. Cl.
*H04L 7/00* (2006.01)
(52) U.S. Cl. .................................................. 375/354
(58) Field of Classification Search .......... 375/354, 375/376, 327, 373, 294, 316; 331/15, 16, 331/17; 327/147, 156
See application file for complete search history.

(56) References Cited

U.S. PATENT DOCUMENTS

| | | | |
|---|---|---|---|
| 6,667,663 B2* | 12/2003 | Ozawa | 331/17 |
| 2002/0136342 A1* | 9/2002 | Lee et al. | 375/376 |
| 2007/0071155 A1* | 3/2007 | Boerstler et al. | 375/376 |

* cited by examiner

*Primary Examiner* — Khai Tran
(74) *Attorney, Agent, or Firm* — Law Office of Gerald Maliszewski; Gerald Maliszewski

(57) ABSTRACT

A system and method are provided for detecting the frequency acquisition of a synthesized signal in a non-synchronous communications receiver. The method accepts a non-synchronous communication signal having an input data signaling frequency, and compares the input data signaling frequency to a synthesized signal frequency. In response to the comparing, a difference signal pulse is generated. More explicitly, the difference signal is generated at a rate responsive to the difference between the input data signaling frequency and the synthesized signal frequency. The method counts synthesized signal pulses occurring simultaneously with the difference signal pulse. If the counted synthesized signal pulses exceed a threshold (before the disappearance of the difference signal pulse), it is determined that the input data signaling frequency is about equal to the synthesized signal frequency, and a lock signal is generated.

15 Claims, 6 Drawing Sheets

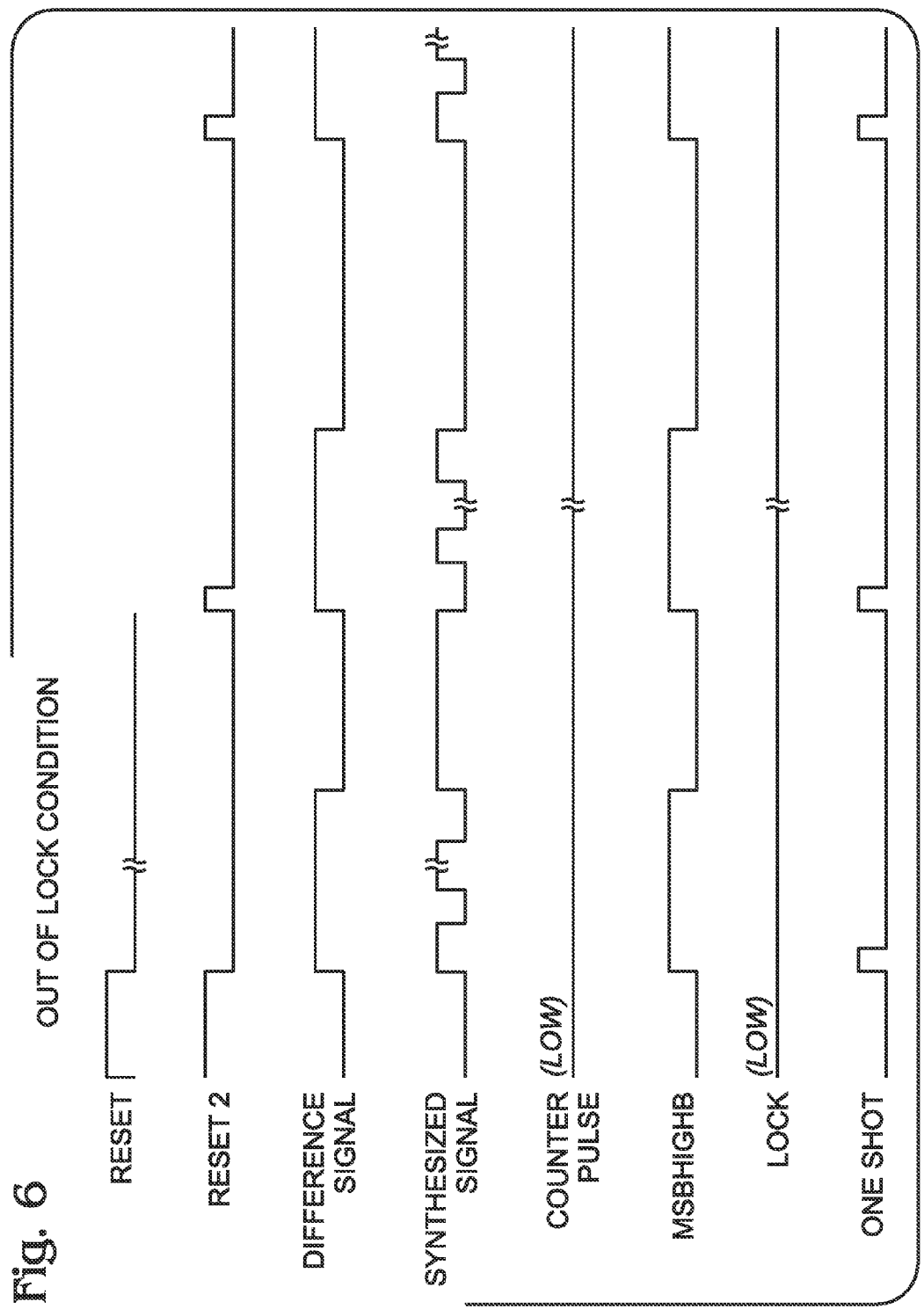

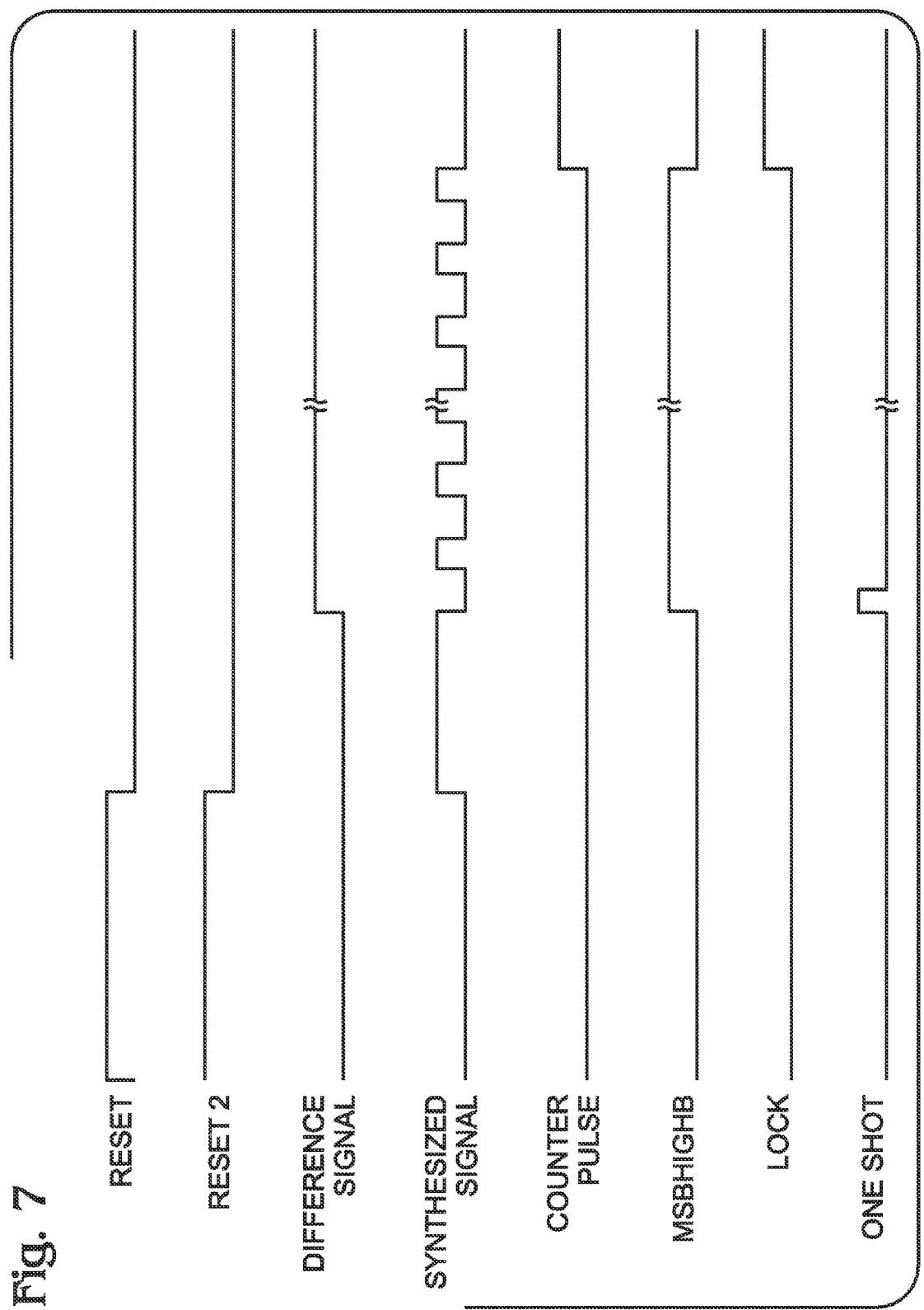

FREQUENCY LOCK DETECTION

BACKGROUND OF THE INVENTION

1. Field of the Invention

This invention generally relates to frequency/phase locked loops and, more particularly to a system and method for determining when a device receiving non-synchronous communication signals should switch from frequency acquisition to phase acquisition.

2. Description of the Related Art

Voltage controlled oscillators are commonly used in monolithic clock data recovery (CDR) units, as they're easy to fabricate and provide reliable results. Clock recovery PLLs generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR) based phase detectors to maintain quadrature phase alignment between the incoming data pattern and the re-timed pattern. XOR based phase detectors have limited frequency discrimination capability, generally restricting frequency offsets to less than the closed loop PLL bandwidth. This characteristic, coupled with the wide tuning range of the voltage controlled oscillator (VCO), requires CDR circuits to depend upon an auxiliary frequency acquisition system.

FIG. 1 depicts a PLL loop consisting of a phase frequency detector, a voltage controlled oscillator, a charge pump, and a low-pass filter placed into the forward path of a negative feedback closed loop configuration (prior art). A charge pump is used if the PFD is insufficient to charge (or discharge) reactances in the loops filter.

There are two basic PLL frequency acquisition techniques. The first is a VCO sweep method. During an out-of-lock condition, auxiliary circuits cause the VCO frequency to slowly sweep across its tuning range in search of an input signal. The sweeping action is halted when a zero-beat note is detected, causing the PLL to lock to the input signal. The VCO sweep method is generally used in microwave frequency synthesis applications. The second type of acquisition aid, commonly found in clock recovery circuits, uses a PFD in combination with an XOR phase detector. When the PLL is locked to a data stream (the REFCLK input), the PLL switches over to a PFD that is driven by a stable reference clock source. The reference clock frequency is proportional to the data stream rate. For example, if the data stream rate is D and the reference clock rate is R, then D α R.

In this manner, the VCO frequency is held very close to the data rate. Keeping the VCO frequency in the proper range of operation facilitates acquisition of the serial data and maintains a stable downstream clock, even if the serial data CDR input is lost. When serial data is again applied to the CDR, the XOR-based phase detector replaces the PFD when frequency is reacquired, and data re-timing resumes using the reference clock.

One difficulty in switching between frequency and phase detectors is in determining the switch point, the point at which the serial data signaling frequency has been acquired. Since the serial data is received as a non-synchronous pattern of random or pseudo-random binary bits, it is not always easy to "find" the carrier or signaling frequency. Further, a determination must be made as to when the VCO frequency is accurate enough to begin operation based upon the phase detection of the reference clock.

It would be advantageous if a method existed that permitted a CDR synthesized signal to switch from frequency acquisition of a non-synchronous communication signal to phase acquisition of a reference clock.

SUMMARY OF THE INVENTION

The present invention describes a system and method for comparing the input data signaling frequency of a non-synchronous communication signal to the frequency of a synthesized signal in frequency acquisition mode. When this lock detect system determines that the frequencies are sufficiently close, a lock detect signal is generated, which the system can use to replace the frequency detector with a reference clock-driven phase detector.

Accordingly, a method is provided for detecting the frequency acquisition of a synthesized signal in a non-synchronous communications receiver. The method accepts a non-synchronous communication signal having an input data signaling frequency, and compares the input data signaling frequency to a synthesized signal frequency. In response to the comparing, a difference signal pulse is generated. More explicitly, the difference signal is generated at a rate responsive to the difference between the input data signaling frequency and the synthesized signal frequency. The method counts synthesized signal pulses occurring simultaneously with the difference signal pulse. If the counted synthesized signal pulses exceed a threshold (before the disappearance of the difference signal pulse), it is determined that the input data signaling frequency is about equal to the synthesized signal frequency, and a lock signal is generated.

In response to the lock signal, receiver operations switch from frequency acquisition mode to phase acquisition. Then, the phase of the synthesized signal, after frequency division, is locked to a reference clock signal. However, if the counted synthesized signal pulses do not exceed the threshold, an out-of-lock signal is generated and receiver operations continue in the frequency acquisition mode.

In one aspect, the counting of synthesized signal pulses simultaneously occurring with the difference signal pulse is performed by dividing the synthesized signal by a predetermined divisor value, and generating a counter pulse. If the counter pulse occurs prior to the termination of the difference signal pulse, it is determining that the input data signaling frequency is about equal to the synthesized signal frequency. The lock signal tolerance is made selectable by varying the divisor value.

Additional details of the above-described method and a non-synchronous communications receiver with a system for detecting the frequency acquisition of a synthesized signal are provided below.

BRIEF DESCRIPTION OF THE DRAWINGS

FIG. 6 is a timing diagram depicting the out-of-lock condition.

FIG. 7 is a timing diagram depicting the lock condition.

DETAILED DESCRIPTION

Figure 2:
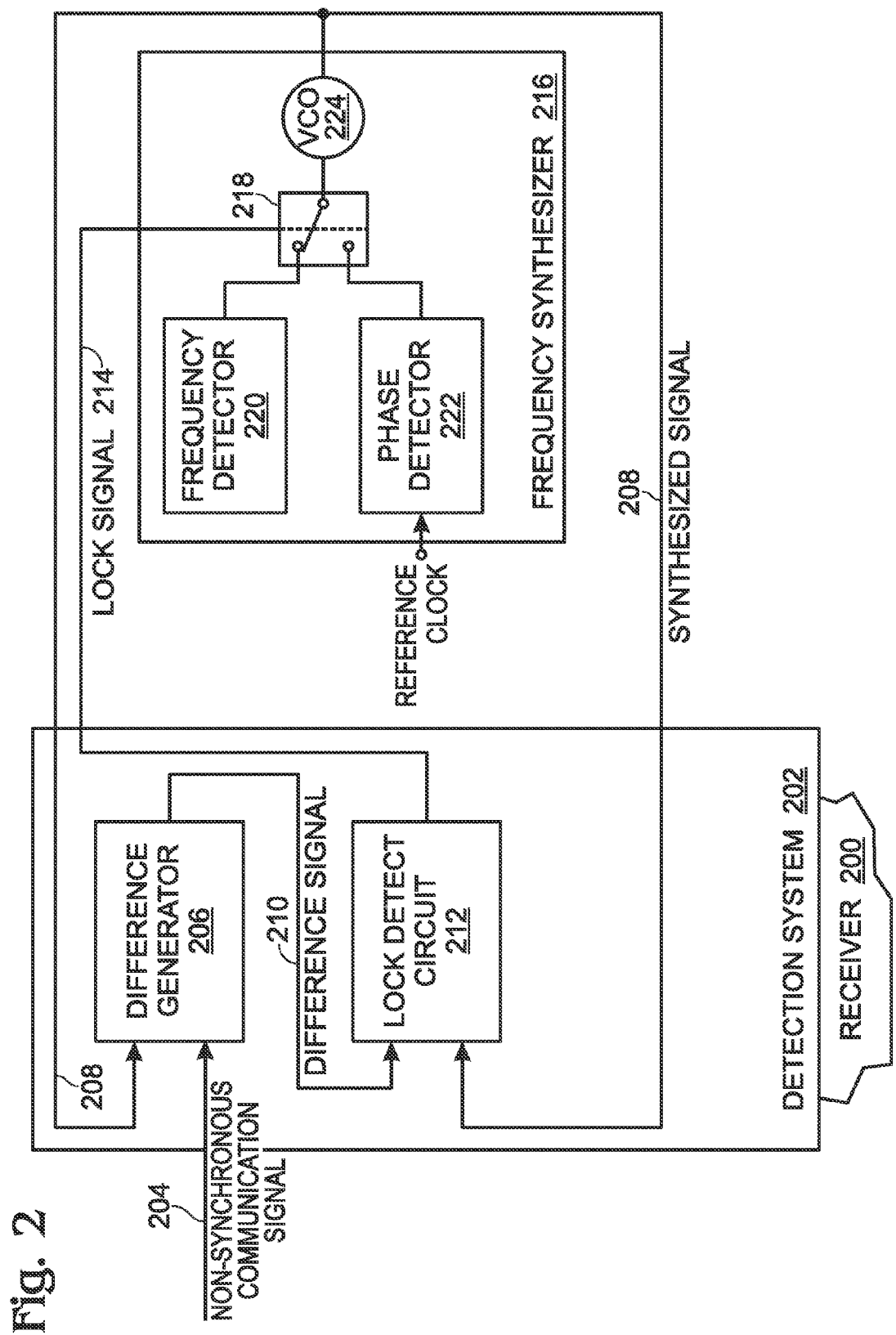
FIG. 2 is a schematic block diagram of a non-synchronous communications receiver with a system for detecting the frequency acquisition of a synthesized signal.

FIG. 2 is a schematic block diagram of a non-synchronous communications receiver 200 with a system for detecting the frequency acquisition of a synthesized signal. The system 202 comprises a receiver port on line 204 to accept a non-synchronous communication signal with an input data signaling frequency. A difference generator 206 has an input on line 204 to accept the communication signal and an input of line 208 to accept a synthesized signal. The difference generator 206 compares the input data signaling frequency to a synthesized signal frequency and supplies a difference signal pulse at an output on line 210. More explicitly, the difference generator 206 compares a first pulse polarity (e.g., the rising edge) of the input data signaling frequency to a first polarity (e.g., the rising edge) of the synthesized signal and generates a difference signal first polarity pulse (e.g., rising edge) at a rate responsive to the difference between the input data signaling frequency and the synthesized signal frequency. In one aspect, the difference generator 206 is a rotational frequency detector. However, the system is not necessarily limited to this type of detector.

A lock detect circuit 212 has an input on line 208 to accept the synthesized signal and an input on line 210 to accept the difference signal. The lock detect circuit 212 counts a number of synthesized signal pulses simultaneously occurring with the difference signal pulse, and if the counted synthesized signal pulses exceed a threshold, determines that input data signaling frequency is about equal to the synthesized signal frequency. When this determination is made, the lock detect circuit 212 supplies a lock signal at an output on line 214.

A frequency synthesizer 216 has an input on line 214 to accept the lock signal. The frequency synthesizer 216 switches operation from the frequency acquisition mode to phase acquisition in response to the lock signal, and supplies a synthesized signal locked to the phase of a reference clock signal. For simplicity, a switch 218 is shown that switches in between a frequency detector 220 and a phase detector 222, in response to the lock signal on line 214. A VCO 224 supplies the synthesized signal on line 208.

The lock detect circuit 212 supplies an out-of-lock signal on line 214 if the counted synthesized signal pulses do not exceed the threshold. For example, the lock signal may be represented by a logic high signal on line 214, and the out-of-lock signal by a logic low. In response the receiving the out-of-lock signal, the frequency synthesizer 216 continues operation in the frequency acquisition mode, where the synthesized signal is acquired with respect to the frequency of the communication signal.

Figure 1:
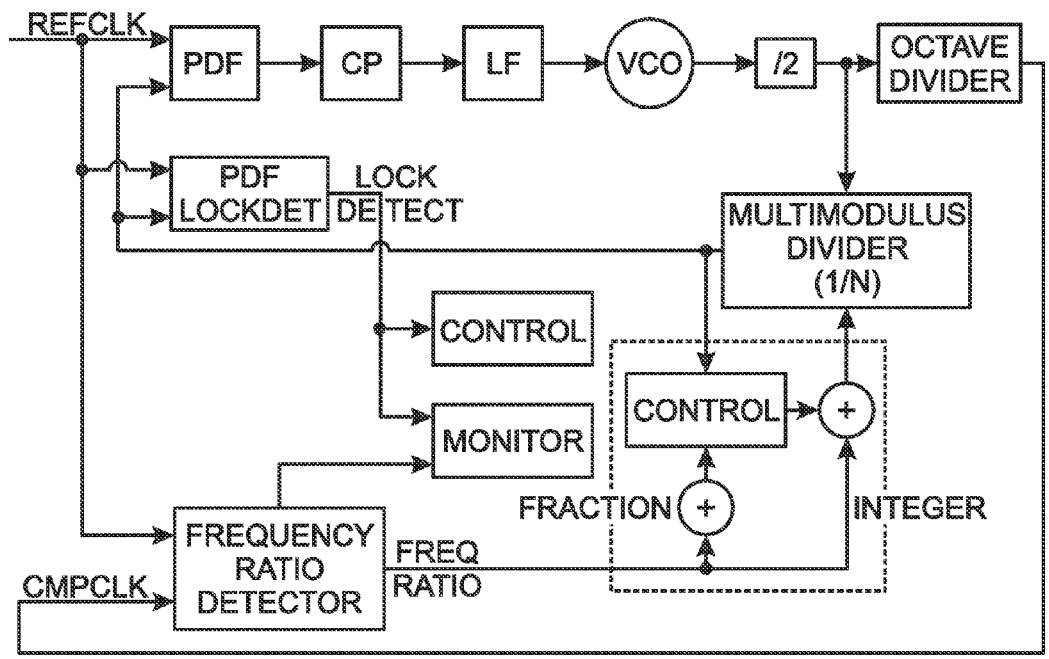
FIG. 1 depicts a PLL loop consisting of a phase frequency detector, a voltage controlled oscillator, a charge pump, and a low-pass filter placed into the forward path of a negative feedback closed loop configuration (prior art).
Figure 3:
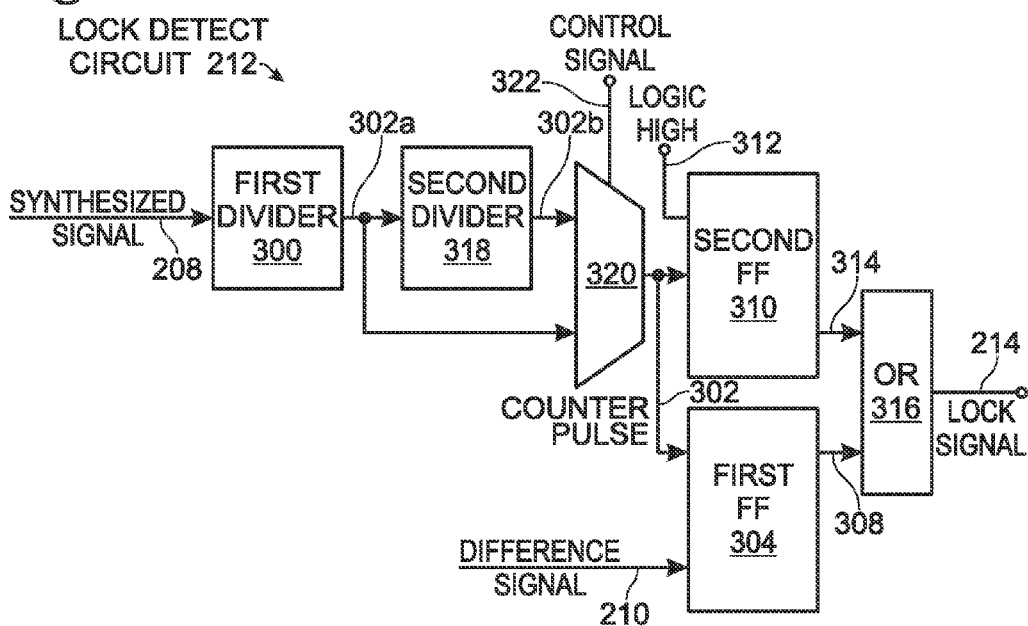
FIG. 3 is a schematic diagram depicting an exemplary lock detect circuit in greater detail.

FIG. 3 is a schematic diagram depicting an exemplary lock detect circuit in greater detail. A first divider 300 has an input on line 208 for accepting the synthesized signal. The first divider 300 divides the synthesized signal by a predetermined first divisor value and supplies a counter pulse with a logic high polarity on line 302a. A first flip flop (FF) 304 has an input on line 302 to accept the counter pulse and an input on line 210 to accept a logic high polarity difference signal. The first FF 304 has an output on line 306 to supply a logic high first FF signal on line 308 when the counter pulse occurs prior to the termination of the difference signal. A second FF 310 has an input connected on line 312 to a logic high and an input on line 302 to accept the counter pulse. The second FF 310 has an output on line 314 to supply a second FF signal with the occurrence of the counter pulse. An OR gate 316 has an inputs on lines 308 and 314 to receive the first and second FF signals, respectively, and an output on line 214 to supply a logic high lock detect signal.

In one aspect as shown, a second divider 318 has an input on line 302 to accept the counter pulse from the first divider 300. The second divider 318 divides the counter pulse by n and supplies a counter/n pulse with a logic high polarity on line 302b. A multiplexer 320 has an input on line 302a to accept the counter pulse, an input on line 302b to accept the counter/n pulse, a control signal on line 322 for selecting, and an output on line 302 to supply the selected input pulse to the first FF 304 and the second flip flop 310. In this manner, the OR gate 316 supplies a lock detect signal with a decreased tolerance between the input data signaling frequency and the synthesized signal frequency in response to selecting the counter/n pulse as the input to the flip-flops.

The lock detect circuit of FIG. 3 is shown enabled with the use of dividers and flip-flops. However, the same logical operations could be performed by other means. Likewise, the operation of the circuitry has been described with the use of positive pulses and rising edges, but the same functions could be obtained using different signal patterns.

Figure 4:
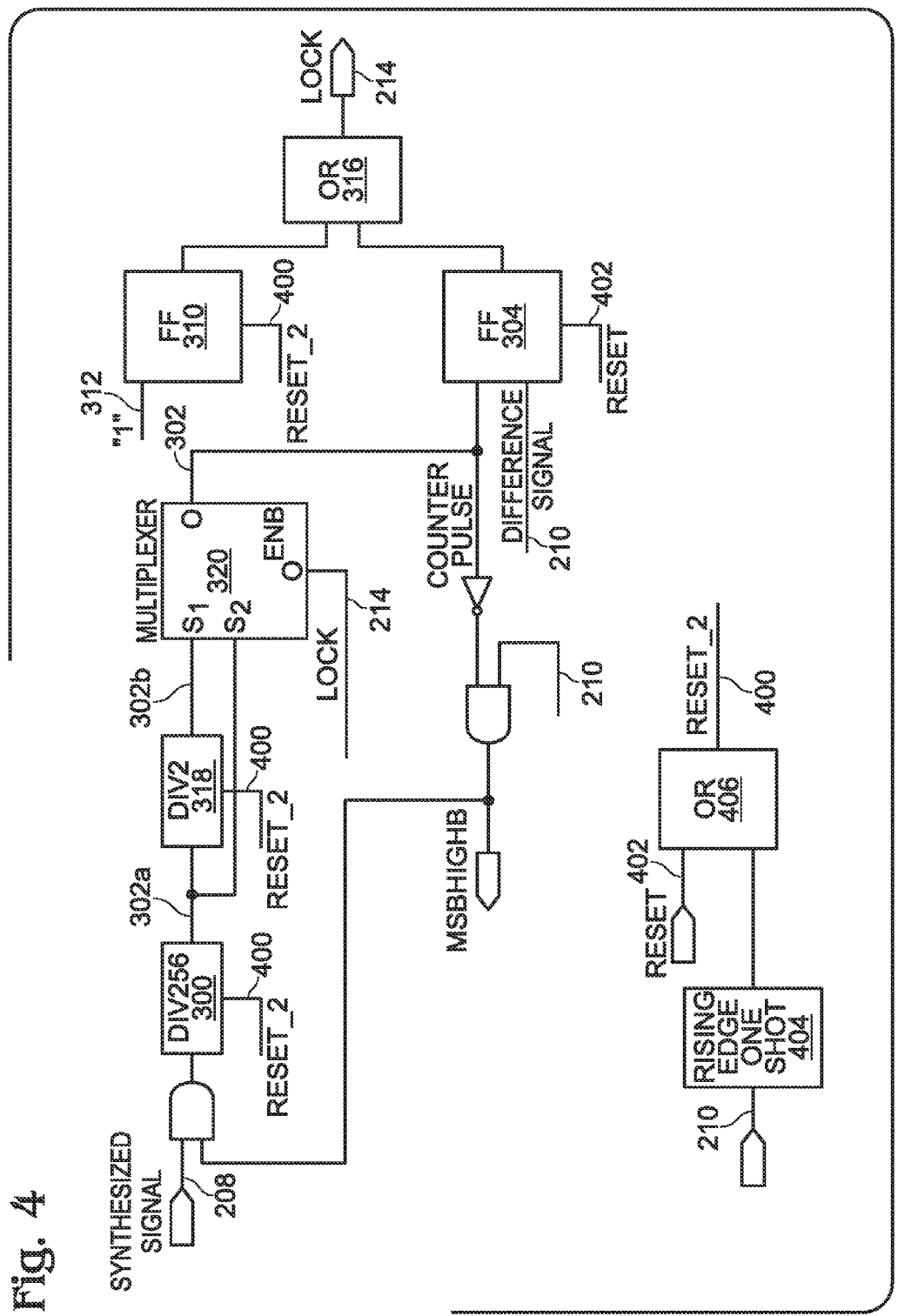
FIG. 4 is a schematic block diagram depicting the lock detect circuit of FIG. 3 is greater detail.

FIG. 4 is a schematic block diagram depicting the lock detect circuit of FIG. 3 is greater detail. The circuitry is shown with RESET and RESET 2 signals. The RESET 2 on line 400 is generated in response to the RESET signal on line 402, using one-shot 404 and OR gate 406. The one-shot 404 is triggered on the rising edge of the difference signal. The RESET 2 signal resets the dividers. The falling edge of the one-shot activates the dividers, and the signal on line 214 is initially set low (out-of-lock). The number of synthesized signal pulses is counted while the difference signal remains high. If the difference signal goes low before the counter pulse is generated, MSBHIHGB does low and the dividers are stopped. The process is repeated with the next rising edge of the difference signal. If a counter pulse is generated, MSB-HIHGB goes low and the counter pulse remains high. The next rising edge of the difference signal clocks the counter pulse through the FFs, generating the logic high lock signal on line 214.

FIG. 6 is a timing diagram depicting the out-of-lock condition. Viewing both FIGS. 5 and 6, it can be seen that because the difference pulse is toggling relatively frequently, indicating that input data signaling frequency and synthesized frequency are not equal, an insufficient number of synthesized signal pulses are counted to trigger the counter pulse. As a result, the lock signal remains low, indicating an out-of-lock condition.

FIG. 7 is a timing diagram depicting the lock condition. Viewing both FIGS. 5 and 7, it can be seen that because the difference pulse stays high, indicating that input data signaling frequency and synthesized frequency are about equal, a sufficient number of synthesized signal pulses are counted to trigger the counter pulse. As a result, the lock signal is triggered.

Functional Description

Figure 5:
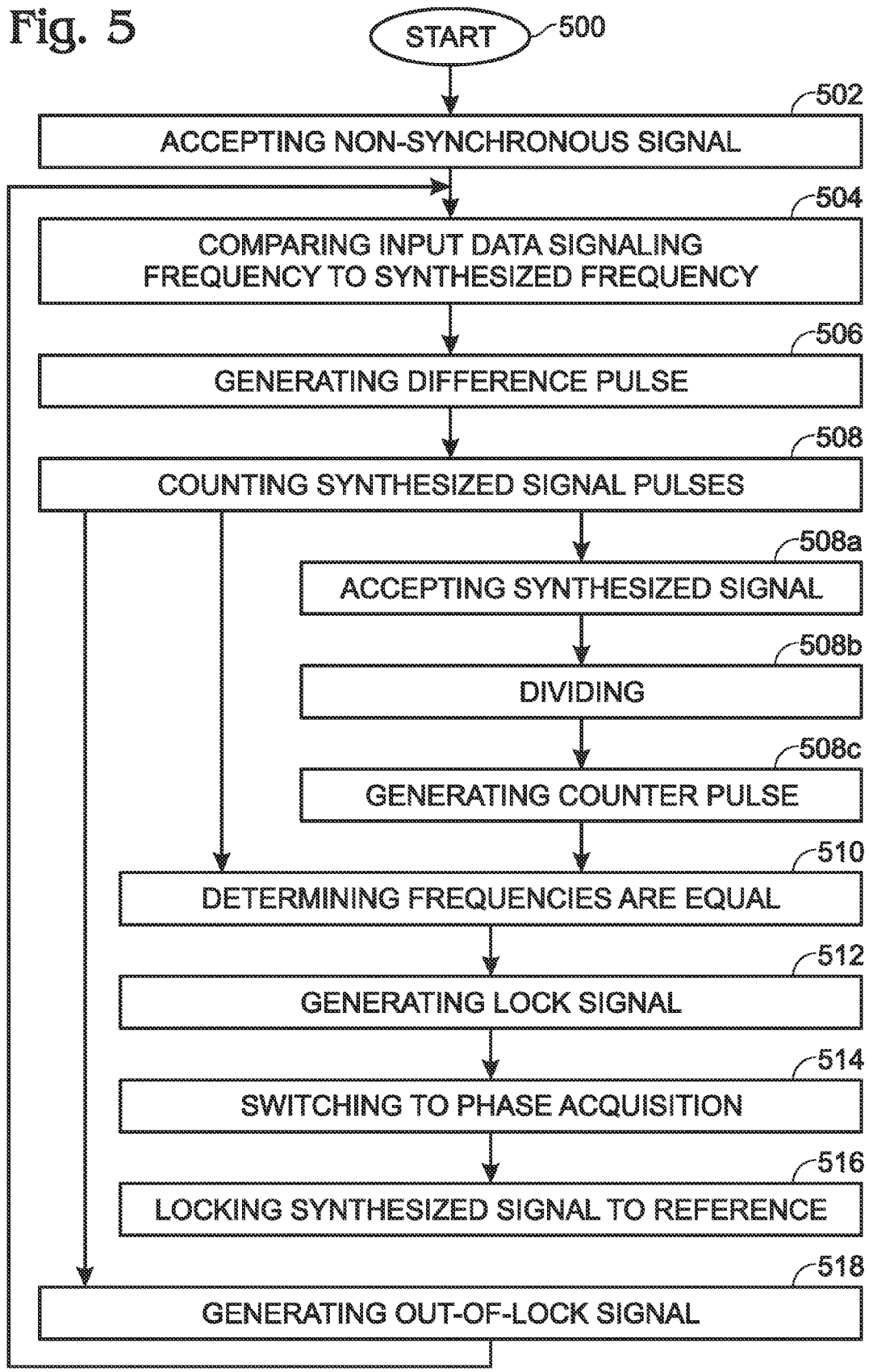
FIG. 5 is a flowchart illustrating a method for detecting the frequency acquisition of a synthesized signal in a non-synchronous communications receiver.

FIG. 5 is a flowchart illustrating a method for detecting the frequency acquisition of a synthesized signal in a non-synchronous communications receiver. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 500.

Step 502 accepts a non-synchronous communication signal having an input data signaling frequency. Step 504 compares the input data signaling frequency to a synthesized signal frequency. In response to the comparing, Step 506 generates a difference signal pulse. Step 508 counts synthesized signal pulses simultaneously occurring with the difference signal pulse. If the counted synthesized signal pulses exceed a threshold, Step 510 determines that the input data signaling frequency is about equal to the synthesized signal frequency, and Step 512 generates a lock signal.

In response to the lock signal, Step 514 switches receiver operation from frequency acquisition mode to phase acquisition. Step 516 locks the phase of the synthesized signal to a reference clock signal. If the counted synthesized signal pulses do not exceed the threshold, Step 518 generates an out-of-lock signal, and the receiver operation continues in frequency acquisition mode (returning to Step 504).

For example, comparing the input data signaling frequency to the synthesized signal frequency in Step 504 includes comparing a first pulse polarity of the communication signal to a first polarity of the synthesized signal. Then, generating the difference signal pulse in Step 506 includes generating a difference signal at a rate responsive to the difference between the input data signaling frequency and the synthesized signal frequency.

In one aspect, counting the number of synthesized signal pulses simultaneously occurring with the difference signal pulse in Step 508 includes substeps. Step 508a accepts the synthesized signal. Step 508b divides the synthesized signal by a predetermined divisor value. Step 508c generates a counter pulse. Then, determining that input data signaling frequency is about equal to the synthesized signal frequency in Step 510 includes generating the counter pulse prior to the termination of the difference signal pulse.

In another aspect, dividing the synthesized signal by the predetermined divisor value in Step 508b includes dividing by a selectable divisor value. Then, determining that input data signaling frequency is about equal to the synthesized signal frequency (Step 510) includes decreasing the tolerance between the input data signaling frequency and the synthesized signal frequency in response to increasing the selectable divisor value.

A system and method for detecting the frequency acquisition of a synthesized signal in a non-synchronous communication device have been presented. Particular circuitry and processes of counting and comparing a difference pulse to a synthesized frequency have been used as examples to illustrate the invention. Likewise, a non-synchronous communication device has been used as an example to provide context for the invention. However, the invention is not limited to merely these examples. Other variations and embodiments of the invention will occur to those skilled in the art.

We claim:

1. In a non-synchronous communications receiver, a method for detecting the frequency acquisition of a synthesized signal, the method comprising:
    accepting a non-synchronous communication signal having an input data signaling frequency;
    comparing the input data signaling frequency to a synthesized signal frequency;
    in response to the comparing, generating a difference signal pulse;
    counting synthesized signal pulses simultaneously occurring with the difference signal pulse;
    if the counted synthesized signal pulses exceed a threshold, determining that the input data signaling frequency is about equal to the synthesized signal frequency;
    generating a lock signal;
    in response to the lock signal, switching receiver operation from frequency acquisition mode to phase acquisition; and,
    locking the phase of the synthesized signal to a reference clock signal.

2. The method of claim 1 further comprising:
    if the counted synthesized signal pulses do not exceed the threshold, generating an out-of-lock signal; and,
    continuing the receiver operation in frequency acquisition mode.

3. The method of claim 1 wherein comparing the input data signaling frequency to the synthesized signal frequency includes comparing a first pulse polarity of the communication signal to a first polarity of the synthesized signal; and,
    wherein generating the difference signal pulse includes generating a difference signal at a rate responsive to the difference between the input, data signaling frequency and the synthesized signal frequency.

4. The method of claim 1 wherein counting the number of synthesized signal pulses simultaneously occurring with the difference signal pulse includes:
    accepting the synthesized signal;
    dividing the synthesized signal by a predetermined divisor value;
    generating a counter pulse; and,
    wherein determining that input data signaling frequency is about equal to the synthesized signal frequency includes generating the counter pulse prior to the termination of the difference signal pulse.

5. The method of claim 4 wherein dividing the synthesized signal by the predetermined divisor value includes dividing by a selectable divisor value; and,
    wherein determining that input data signaling frequency is about equal to the synthesized signal frequency includes decreasing the tolerance between the input data signaling frequency and the synthesized signal frequency in response to increasing the selectable divisor value.

6. A non-synchronous communications receiver with a system for detecting the frequency acquisition of a synthesized signal, the system comprising:
    a receiver port to accept a non-synchronous communication signal with an input data signaling frequency;
    a difference generator having inputs to accept the communication signal and a synthesized signal, the difference generator comparing the input data signaling frequency to a synthesized signal frequency and supplying a difference signal pulse at an output;
    a lock detect circuit having inputs to accept the synthesized signal and the difference signal, the lock detect circuit counting a number of synthesized signal pulses simultaneously occurring with the difference signal pulse, and if the counted synthesized signal pulses exceed a threshold, determining that input data signaling frequency is about equal to the synthesized signal frequency and supplying a lock signal at an output, and the lock detect circuit supplying an out-of-lock signal if the counted synthesized signal pulses do not exceed the threshold; and,
    the system further comprising:
    a frequency synthesizer having an input to accept the out-of-lock signal, the frequency synthesizer continuing operation in the frequency acquisition mode in response to the out-of-lock signal, where the synthesized signal is acquired with respect to the frequency of the communication signal.

7. The system of claim 6 further comprising:
a frequency synthesizer having an input to accept the lock signal, the frequency synthesizer switching operation from frequency acquisition mode to phase acquisition in response to the lock signal, and supplying a synthesized signal locked to the phase of a reference clock signal.

8. The system of claim 6 wherein the difference generator compares a first pulse polarity of the input data signaling frequency to a first polarity of the synthesized signal and generates a difference signal first polarity pulse at a rate responsive to the difference between the input data signaling frequency and the synthesized signal frequency.

9. The system of claim 6 wherein the lock detect circuit includes:
a first divider having an input for accepting the synthesized signal, the first divider dividing the synthesized signal by a predetermined first divisor value and supplying a counter pulse with a logic high polarity; and,
a first flip flop (FF) having inputs to accept the counter pulse and a logic high polarity difference signal, and an output to supply a logic high first FF signal when the counter pulse occurs prior to the termination of the difference signal;
a second FF having inputs connected to a logic high and the counter pulse, and an output to supply a second FF signal with the occurrence of the counter pulse; and,
an OR gate having inputs connected to receive the first and second FF signals, and an output to supply a logic high lock detect signal.

10. The system of claim 9 further comprising:
a second divider having an input for accepting the counter pulse from the first divider, the second divider dividing the counter pulse by n and supplying a counter/n pulse with a logic high polarity; and,
a multiplexer having inputs to accept the counter pulse, the counter/n pulse, a control signal for selecting, and an output to supply the selected input pulse to the first and second flip flops; and,
wherein the OR gate supplies a lock detect signal with a decreased tolerance between the input data signaling frequency and the synthesized signal frequency in response to selecting the counter/n pulse as the input to the flip flops.

11. A non-synchronous communications receiver with a system for detecting the frequency acquisition of a synthesized signal, the system comprising:
a receiver port to accept a non-synchronous communication signal with an input data signaling frequency;
a difference generator having inputs to accept the communication signal and a synthesized signal, the difference generator comparing the input data signaling frequency to a synthesized signal frequency and supplying a difference signal pulse at an output;
a lock detect circuit having inputs to accept the synthesized signal and the difference signal, the lock detect circuit counting a number of synthesized signal pulses simultaneously occurring with the difference signal pulse, and if the counted synthesized signal pulses exceed a threshold, determining that input data signaling frequency is about equal to the synthesized signal frequency and supplying a lock signal at an output; and,
a frequency synthesizer having an input to accept the lock signal, the frequency synthesizer switching operation from frequency acquisition mode to phase acquisition in response to the lock signal, and supplying a synthesized signal locked to the phase of a reference clock signal.

12. The system of claim 11 wherein the difference generator compares a first pulse polarity of the input data signaling frequency to a first polarity of the synthesized signal and generates a difference signal first polarity pulse at a rate responsive to the difference between the input data signaling frequency and the synthesized signal frequency.

13. The system of claim 11 wherein the lock detect circuit includes:
a first divider having an input for accepting the synthesized signal, the first divider dividing the synthesized signal by a predetermined first divisor value and supplying a counter pulse with a logic high polarity; and,
a first flip flop (FF) having inputs to accept the counter pulse and a logic high polarity difference signal, and an output to supply a logic high first FF signal when the counter pulse occurs prior to the termination of the difference signal;
a second FF having inputs connected to a logic high and the counter pulse, and an output to supply a second FF signal with the occurrence of the counter pulse; and,
an OR gate having inputs connected to receive the first and second FF signals, and an output to supply a logic high lock detect signal.

14. The system of claim 11 further comprising:
a second divider having an input for accepting the counter pulse from the first divider, the second divider dividing the counter pulse by n and supplying a counter/n pulse with a logic high polarity; and,
a multiplexer having inputs to accept the counter pulse, the counter/n pulse, a control signal for selecting, and an output to supply the selected input pulse to the first and second flip flops; and,
wherein the OR gate supplies a lock detect signal with a decreased tolerance between the input data signaling frequency and the synthesized signal frequency in response to selecting the counter/n pulse as the input to the flip flops.

15. The system of claim 11 wherein the lock detect circuit supplies an out-of-lock signal if the counted synthesized signal pulses do not exceed the threshold; and,
wherein the frequency synthesizer has an input to accept the out-of-lock signal, the frequency synthesizer continuing operation in the frequency acquisition mode in response to the out-of-lock signal, where the synthesized signal is acquired with respect to the frequency of the communication signal.

* * * * *